(12) United States Patent
Natarajan et al.

(10) Patent No.: US 8,410,602 B2
(45) Date of Patent: Apr. 2, 2013

(54) COOLING SYSTEM FOR SEMICONDUCTOR DEVICES

(75) Inventors: Venkat Natarajan, Bangalore (IN);
Arun Chandrasekhar, Bangalore (IN);
Pr Patel, Chandler, AZ (US); Vittal Kini, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 934 days.

(21) Appl. No.: 11/974,595

(22) Filed: Oct. 15, 2007

(65) Prior Publication Data

US 2009/0096086 A1 Apr. 16, 2009

(51) Int. Cl.
*H01L 23/34* (2006.01)
*H01L 23/10* (2006.01)

(52) U.S. Cl. ........ 257/714; 257/706; 257/712; 257/718; 257/719; 257/E23.051; 361/704; 361/707; 361/719; 361/720; 361/699; 439/176; 439/190; 439/196; 439/257; 439/821

(58) Field of Classification Search .......... 257/706, 257/712, 714–719, 721–723, E23.098, E23.099, 257/E23.051, E23.101, E23.088; 361/688, 361/704, 707, 719, 720, 699, 785; 165/80.3; 439/176, 190, 196, 257, 821
See application file for complete search history.

(56) References Cited

U.S. PATENT DOCUMENTS

| | | | | |
|---|---|---|---|---|
| 4,468,717 A * | 8/1984 | Mathias et al. | ............... | 361/702 |
| 5,150,274 A * | 9/1992 | Okada et al. | ............... | 361/703 |
| 5,920,457 A * | 7/1999 | Lamb et al. | ............... | 361/699 |
| 5,923,533 A * | 7/1999 | Olson | ............... | 361/699 |
| 6,191,946 B1 * | 2/2001 | Yu et al. | ............... | 361/704 |
| 6,304,450 B1 * | 10/2001 | Dibene et al. | ............... | 361/704 |
| 6,347,036 B1 * | 2/2002 | Yeager et al. | ............... | 361/679.46 |
| 6,411,512 B1 * | 6/2002 | Mankaruse et al. | ............... | 361/700 |
| 6,567,269 B2 * | 5/2003 | Homer et al. | ............... | 361/700 |
| 6,648,064 B1 * | 11/2003 | Hanson | ............... | 165/120 |
| 6,753,205 B2 * | 6/2004 | Halahan | ............... | 438/107 |
| 7,117,114 B2 * | 10/2006 | Arabi et al. | ............... | 702/132 |
| 7,251,138 B2 * | 7/2007 | Hornung et al. | ............... | 361/704 |
| 7,269,015 B2 * | 9/2007 | Hornung et al. | ............... | 361/704 |
| 7,280,360 B2 * | 10/2007 | Malone et al. | ............... | 361/704 |
| 7,388,286 B2 * | 6/2008 | Kim et al. | ............... | 257/706 |
| 2002/0003232 A1 * | 1/2002 | Ahn et al. | ............... | 257/81 |
| 2005/0068728 A1 * | 3/2005 | Chu et al. | ............... | 361/690 |
| 2005/0124147 A1 * | 6/2005 | Shiu et al. | ............... | 438/613 |
| 2008/0131658 A1 * | 6/2008 | Wakharkar et al. | ............... | 428/137 |
| 2008/0155990 A1 * | 7/2008 | Gupta et al. | ............... | 62/3.2 |
| 2008/0258295 A1 * | 10/2008 | Wilkins et al. | ............... | 257/713 |
| 2008/0259566 A1 * | 10/2008 | Fried | ............... | 361/699 |
| 2009/0004902 A1 * | 1/2009 | Pandey et al. | ............... | 439/331 |

* cited by examiner

*Primary Examiner* — Colleen Matthews
*Assistant Examiner* — Galina Yushina
(74) *Attorney, Agent, or Firm* — Trop, Pruner & Hu, P.C.

(57) ABSTRACT

In one embodiment, the present invention includes a socket for a semiconductor package, where the socket has a frame with a segmented design, where socket streets are located between the segments. One or more of the streets may include a conduit to enable thermal transfer during operation of the semiconductor package. Other embodiments are described and claimed.

17 Claims, 6 Drawing Sheets

COOLING SYSTEM FOR SEMICONDUCTOR DEVICES

BACKGROUND

As semiconductor devices such as processors, memories and other components become increasingly smaller, faster and more power dependent, great amounts of heat can be generated during operation of these components. Accordingly, many systems include thermal solutions to provide cooling for such devices. While these solutions can vary widely, many processors are housed in a processor package that includes a heat spreader to be coupled to a thermal solution such as a heat sink adapted on top of the package. While this heat sink can provide some amount of cooling for a processor, sometimes great temperatures can still be reached.

Furthermore, as devices become smaller, proposals have been made to develop three-dimensional (3D) packaging or stacks of packaged devices. However, providing cooling for such devices can be very difficult.

DETAILED DESCRIPTION

Embodiments provide techniques for a package-underside cooling system for 3D stacked silicon devices that may be particularly useful for stacked processor/memory complexes, such as used with multi- and many-core central processing units (CPUs). Embodiments may be applicable to the situation where one or more dies are located on an underside of a main package substrate and under normal operation are situated inside the socket cavity. These dies can be memory dies (e.g., dynamic random access memory (DRAM) and/or static random access memories (SRAM)) or dies with other functions such as a security die or voltage regulators, etc. In all these cases, the cooling of the secondary die has been a major bottleneck in the past because the socket acted to muffle the heat generated by the underside dies.

One embodiment of the present invention uses heat pipes coupled with a segmented socket to route the heat generated by the underside die (and other present die such as the CPU die) away from the socket region. A segmented socket provides gaps between the different socket elements that can be used as pathways to route the heat pipe out of the socket region. Furthermore, in a segmented socket, the input/output (I/O) pins/lands/terminals from the package are localized, as described below, thus creating "socket streets" for passage of the heat pipe. There is, therefore, no hindrance to the exit of the heat pipe out of the socket. Once the heat pipe is routed out of the socket region, the heat it carries can be sunk to either a processor heat sink or to a remote heat exchanger (as in a laptop).

Figure 1A:
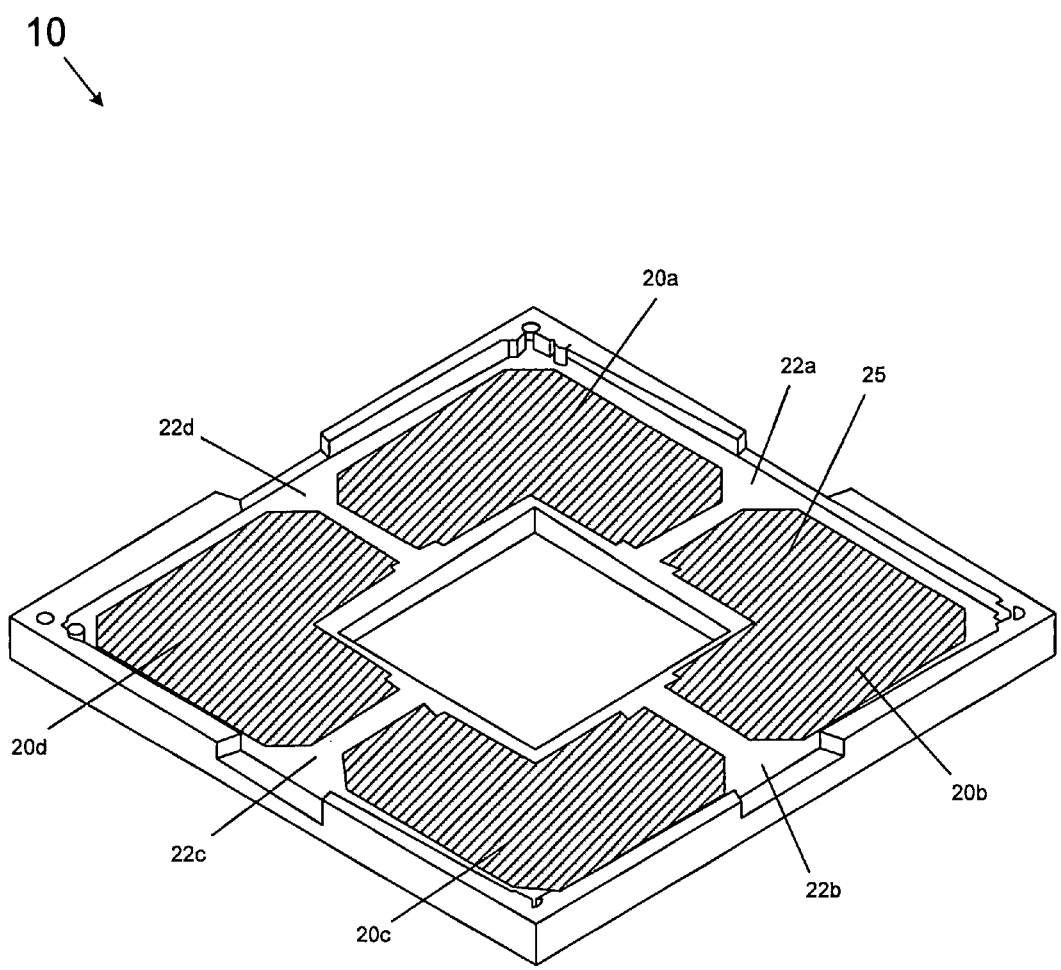
FIGS. 1A-C are perspective views of a segmented socket in accordance with one embodiment of the present invention.
Figure 1B:
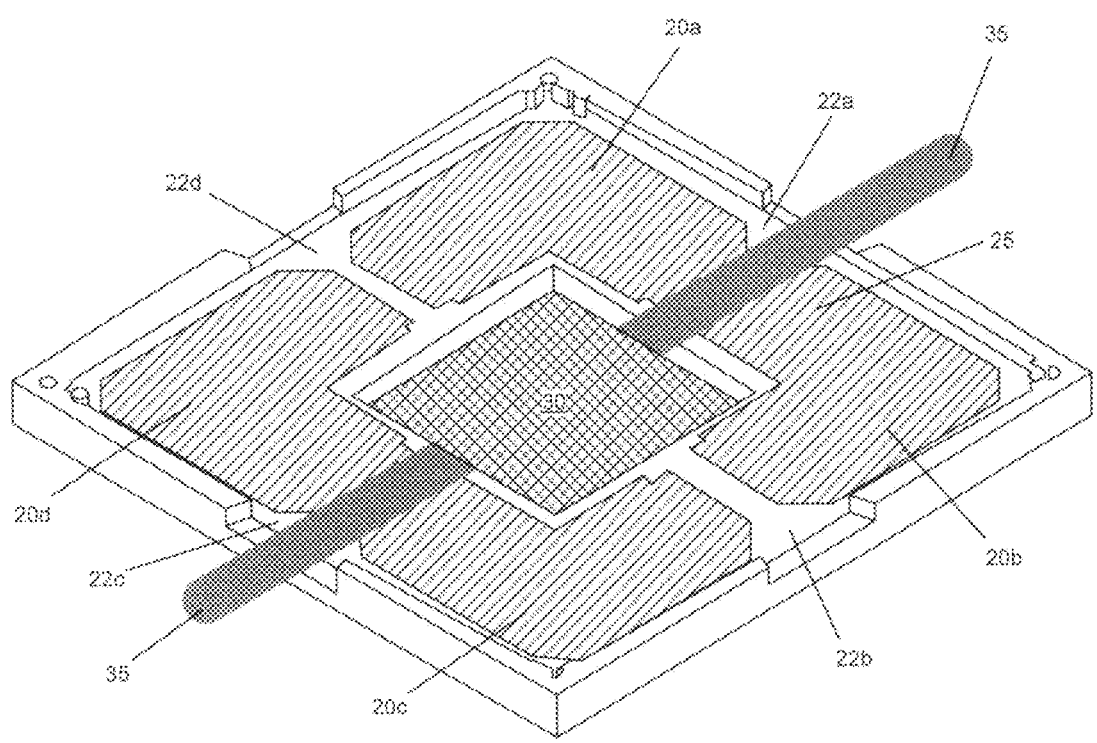
Figure 1C:
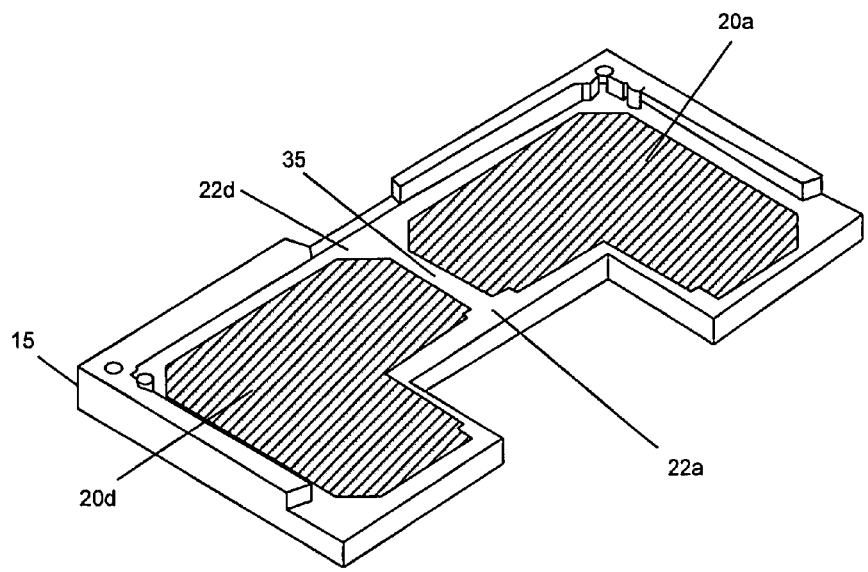

Referring now to FIGS. 1A-C, shown are perspective views of a segmented socket in accordance with one embodiment of the present invention. As shown in FIG. 1A, a socket 10 may include a frame 15 having a plurality of individual segments $20_a$-$20_b$ (generically segments 20) mounted within frame 15. In various embodiments, at least one of segments 20 may include localized input/output (I/O) pins 25 (e.g., for coupling to one or more die including a package substrate), along with other pins such as power and other pins. By using a segmented design in accordance with an embodiment of the present invention, so-called socket streets $22_a$-$22_d$ (generically socket street 22) may be realized. These socket streets may be used to provide routing for a heat solution such as heat pipes or other conduits. While shown with four individual segments in the embodiment of FIG. 1A, the scope of the present invention is not limited in this regard.

Referring now to FIG. 1B, shown is another embodiment of a socket 10. In addition to the segmented socket design, socket 10 is further adapted with a metal plate 30, which may be a copper plate to provide for thermal transfer. More specifically, metal plate 30 may include an embedded heat pipe which communicates with heat pipe 35 coupled through socket streets 22a and 22c. While shown with these particular connections in FIG. 1B, other implementations are certainly possible. In this way, heat generated by semiconductor devices, and more particularly such devices as may be adapted on another side of a processor or other package that is closely adapted to metal plate 30 may have its heat dissipated through plate 30 and heat pipes 35, which may be coupled to a thermal solution such as a heat sink of the processor, a fan or other separate heat sink or other thermal solution.

FIG. 1C shows a portion of a segmented socket in which a partial view of frame 15 is present. Two quadrants 21a and 21d are shown prior to mounting of corresponding socket segments including connection pins. However, note that frame 15 provides for socket street $22_a$ which may include a heat pipe 35 that is routed therethrough to enable heat dissipation.

Figure 2:
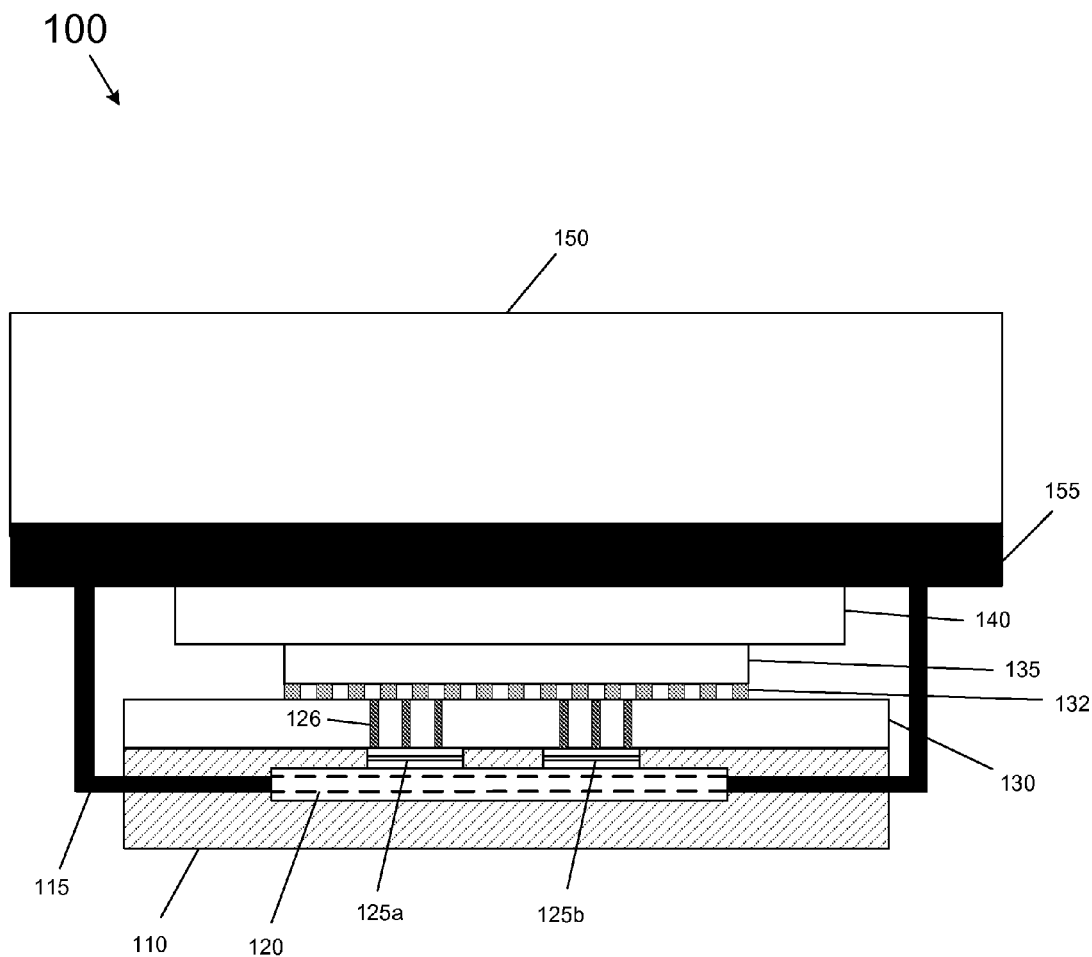
FIG. 2 is a cross-sectional view of a cooling system in accordance with one embodiment of the present invention.

Referring now to FIG. 2, shown is a cross-sectional view of a cooling system in accordance with one embodiment of the present invention. As shown in FIG. 2, system 100 may provide for cooling of a processor package including a package substrate 130, which may be adapted to a circuit board (not shown in FIG. 2), a processor, i.e., a CPU 135, and to which is adapted an integrated heat spreader (IHS) 140. Note further that in the embodiment of FIG. 2, the package includes multiple die $125_a$ and $125_b$ (generically die 125) (although more may be present), mounted on an underside of substrate 130. In one embodiment, such die may correspond to memory devices such as DRAMs, flash memories or other such semiconductor devices. Note that dies 125 may be coupled by vias 126 within package substrate 130, which may be through silicon vias (TSVs) and by contacts 132 to CPU 135. By using these short interconnects, improved data transfer speeds between the separate die may be realized.

Furthermore, by using a cooling system in accordance with an embodiment of the present invention, improved cooling of the package including these underside die may be realized. Specifically, as shown in FIG. 2, a segmented socket 110 is provided to receive the package. Using a segmented design such as described above with regard to FIGS. 1A-1C, a heat pipe 115 may be provided within socket streets of socket 100. Furthermore, a metal plate 120, such as a copper plate may be adapted within socket 110. In this way, heat pipe 115 couples to a thermal solution, namely a heat sink 150 adapted above the package. Specifically, as shown in FIG. 2, a heat sink base 155 is adapted to IHS 140 and is further coupled to heat pipe 115 to enable heat generated during operation to be transferred to heat sink 150 to cool the package. While shown with this particular implementation in the embodiment of FIG. 2, understand that the scope of the present invention is not limited in this regard, and many other implementations are possible.

Figure 3:
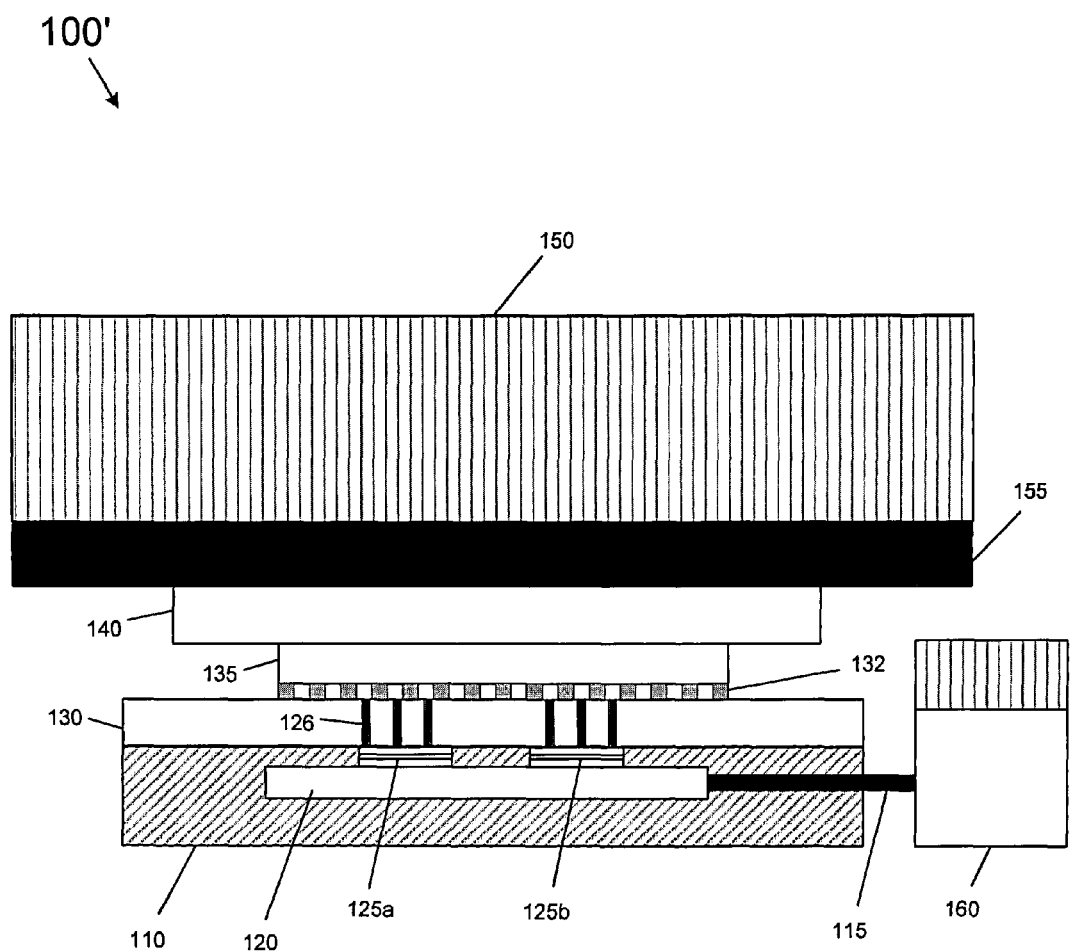
FIG. 3 is a cross-section view of another cooling system in accordance with an embodiment of the present invention.

For example, referring now to FIG. 3, shown is another cooling system 100'. As shown in FIG. 3, system 100' includes similar components to that described above regarding FIG. 2. However, note that heat pipe 115 adapted within socket 110 and routed through socket streets is instead coupled to a remote heat exchanger 160. While the scope of the present invention is not limited in this regard, this heat exchanger may correspond to a separate heat sink, cooling block, fan or other such device.

Figure 4:
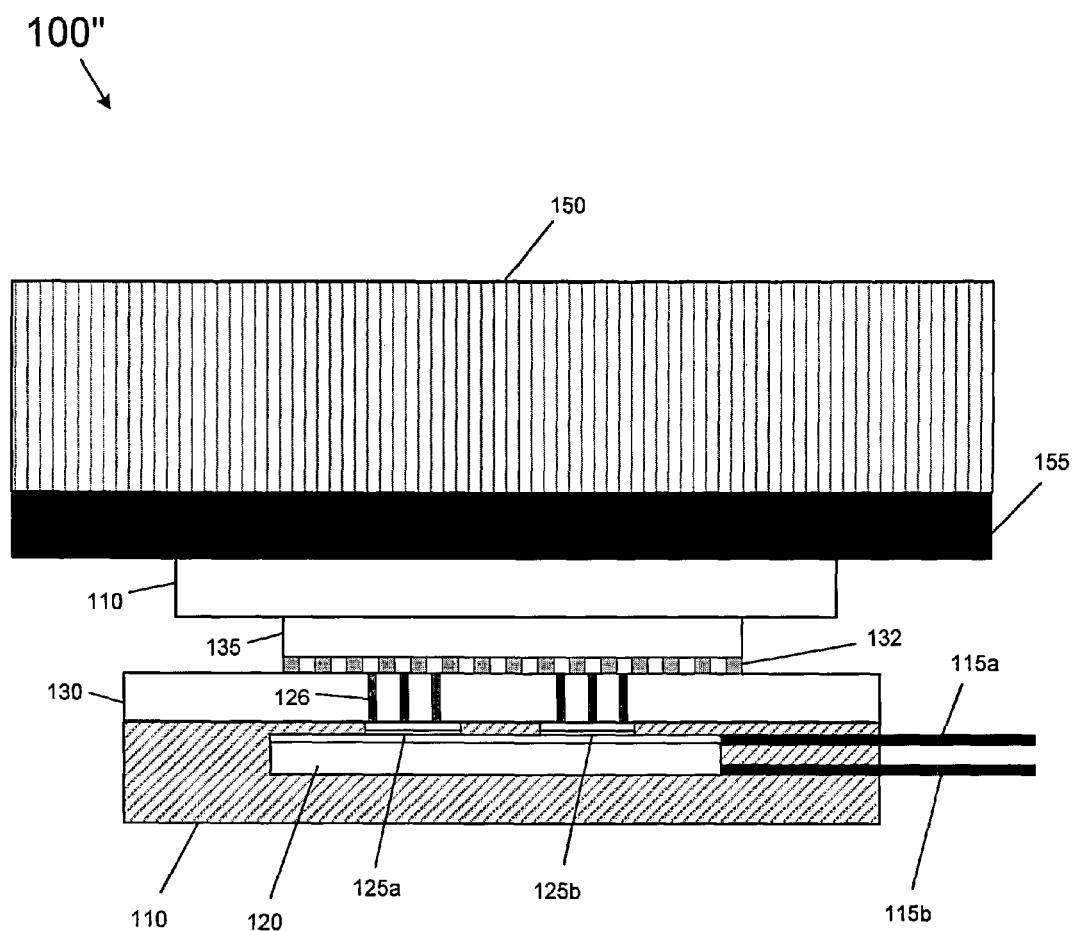
FIG. 4 is a cooling system in accordance with yet another embodiment of the present invention.

Still further embodiments are possible. Referring now to FIG. 4, shown is a cooling system in accordance with yet another embodiment of the present invention. As shown in FIG. 4, cooling system 100", which includes similar components to those discussed above regarding FIGS. 2 and 3, includes a pair of conduits $115_a$ and $115_b$ which are coupled to a cold plate 120. Using conduits $115_a$ and $115_b$, a liquid coolant may be circulated through cold plate 120 and to another portion of a heat solution (e.g., a remote heat exchanger), providing greater cooling of the package.

In some embodiments, up to approximately 40 watts (W) of heat may be removed using a remote heat sink such as shown in FIG. 3 and about 25W of heat using the processor heat sink shown in FIG. 2. Heat pipes in accordance with an embodiment of the present invention may be flattened to fit within the socket streets, and in some embodiments the heat pipes can have dimensions between approximately 4 millimeters (mm) to 8 mm in diameter. After flattening, the height of the heat pipe is approximately 2.5 mm.

Underside cooling technology in accordance with an embodiment of the present invention may thus allow the realization of several silicon device-stacking options (e.g., processor and DRAM, processor and voltage regulators etc.) that are not presently possible because of the problem of removing the heat trapped between the socket and the package substrate. Embodiments further enable dies on the underside of the package (e.g., DRAMs) to be an electrically very short distance (approximately the thickness of the package substrate material) away from the die on top of the package (e.g., CPU). This allows very good interconnect signaling performance between the topside and underside dies. Thus embodiments may use localized I/O from the package underside for purposes of a thermal solution. Further, the thermal solution uses a multi-piece socket which is used to provide routing for heat removal out of the socket region. As described above, this solution can be used with either the main processor heat sink or a remote heat exchanger. Still further, as shown in FIG. 4 embodiments can be used with liquid cooling, which can provide a significant increase in cooling capability.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a segmented socket to receive a single semiconductor package, the socket to a couple to a circuit board and having a frame including a plurality of segments with gaps therebetween and mounted in the frame, each of the plurality of segments with including terminals to be coupled to corresponding contacts of the semiconductor package, the frame including a plurality of streets located between the segments, the terminals localized within the plurality of segments and not within the plurality of streets, at least one of the streets including a conduit within the at least one street and routed therethrough to enable thermal transfer during operation of the semiconductor package, wherein the conduit is to be coupled to a thermal solution outside of the socket, and a metal plate adapted within an interior of the socket and surrounded by the plurality of segments, wherein the metal plate includes at least one embedded conduit coupled to the conduit within one of the streets, which in turn is coupled to a heat sink coupled to an integrated heat spreader of the semiconductor package.

2. The apparatus of claim 1, wherein each of the plurality of streets is located between a pair of the segments.

3. The apparatus of claim 1, wherein the frame includes a plurality of quadrants, and each of the plurality of segments is mounted in a corresponding quadrant.

4. The apparatus of claim 1, wherein the integrated heat spreader is above the top portion of the semiconductor package and the socket is below a bottom portion of the semiconductor package.

5. The apparatus of claim 1, wherein the semiconductor package includes a package substrate having a plurality of vias to couple a first die on an underside of the package substrate to a second die on a top side of the package substrate.

6. The apparatus of claim 5, wherein the first die comprises a memory and the second die comprises a processor.

7. The apparatus of claim 5, wherein the first die mates with a metal plate.

8. A system comprising:
a circuit board having a primary side and a secondary side, the primary side including a segmented socket coupled thereto, the socket to receive a single semiconductor package and having a frame including a plurality of segments with gaps therebetween and mounted in the frame, each of the plurality of segments including terminals to be coupled to corresponding contacts of the semiconductor package, the frame including a plurality of streets, each located between a pair of the segments, the terminals localized within the plurality of segments and not within the plurality of streets, at least one of the streets including a conduit within the at least one street and routed therethrough to enable thermal transfer during operation of the semiconductor package and a metal plate adapted within an interior of the socket and bellow the semiconductor package to adapt to a second semiconductor device of the semiconductor package, the metal plate surrounded by the plurality of segments, wherein the metal plate includes at least one embedded conduit to communicate with the conduit within the at least one street;
the semiconductor package having a package substrate, a first semiconductor device coupled to a topside of the package substrate and a second semiconductor device coupled to a backside of the package substrate, wherein the first semiconductor device and the second semiconductor device are coupled together by a plurality of through silicon vias within the package substrate; and
a heat pipe coupled to the conduit, the heat pipe extending from the socket to the thermal solution.

9. The system of claim 8, wherein the heat pipe is coupled to a heat sink coupled to an integrated heat spreader of the semiconductor package.

10. The system of claim 8, wherein the conduit within one of the streets has a flattened shape.

11. A system comprising:

a segmented socket to receive a single semiconductor package and having a frame including a plurality of segment with gaps there between and mounted in the frame, and each of the plurality of segments including terminal to be coupled to corresponding contacts of the semiconductor package, the frame including a plurality of streets, each located between a pair of the segments, at least one of the streets including a conduit within the at least one street and routed therethrough and a metal plated adapted within an interior of the socket and surrounded by the plurality of segments, wherein the metal plate includes at least one embedded conduit coupled to the conduit within one of the streets; and the semiconductor package having a package substrate, a processor coupled to a first side of the package substrate and at least one memory coupled to a second side of the package substrate, wherein the processor is to be cooled by a heat sink coupled to a topside of the semiconductor package via an integrated heat spreader and the at least one memory is to be cooled by the conduit rooted underside of the semiconductor package that is in communication with the heat sink.

12. The system of claim 11, wherein the package substrate includes a plurality of vias to couple the processor and the heat at least one memory.

13. The system of claim 11, further comprising a heat pipe coupled to the conduit, the heat pipe extending from the socket to the heat sink.

14. The system of claim 13, wherein the heat pipe is coupled to the heat sink coupled to the integrated heat spreader of the semiconductor package.

15. The system of claim 11, further comprising a metal plate adapted within an interior of the socket and below the semiconductor package to adapt to the at least one memory.

16. The system of claim 15, wherein the metal plate is surrounded by the plurality of segments.

17. The system of 15, wherein the metal plate includes at least one embedded conduit to communicate with the conduit within the at least one street of the socket.

* * * * *

UNITED STATES PATENT AND TRADEMARK OFFICE
CERTIFICATE OF CORRECTION

PATENT NO. : 8,410,602 B2
APPLICATION NO. : 11/974595
DATED : April 2, 2013
INVENTOR(S) : Venkat Natarajan et al.

It is certified that error appears in the above-identified patent and that said Letters Patent is hereby corrected as shown below:

In the Specification:

Column 3:
Line 62, "socket to a couple" should be --socket to couple--

Column 3:
Line 65, "segments with including" should be --segments including--

In the Claims:

Column 4:
Line 47, "and bellow" should be --and below--

Column 5:
Line 11, "plated" should be --plate--

Signed and Sealed this
Eighteenth Day of June, 2013

Teresa Stanek Rea
*Acting Director of the United States Patent and Trademark Office*